United States Patent

Sato

Patent Number: 5,805,090
Date of Patent: Sep. 8, 1998

[54] DISPLACEMENT AMOUNT DETECTION METHOD AND APPARATUS

[75] Inventor: Makoto Sato, Tokyo, Japan

[73] Assignee: Canon Kabushiki Kaisha, Tokyo, Japan

[21] Appl. No.: 513,620

[22] Filed: Aug. 10, 1995

[30] Foreign Application Priority Data

Aug. 24, 1994 [JP] Japan .................................. 6-222444

[51] Int. Cl.$^6$ .................................................. H03M 1/48
[52] U.S. Cl. .......................................... 341/116; 341/139
[58] Field of Search .................................... 341/112, 115, 341/116, 139

[56] References Cited

U.S. PATENT DOCUMENTS

| | | | |
|---|---|---|---|
| 4,360,730 | 11/1982 | Breslow | 250/231 SE |
| 4,360,889 | 11/1982 | Liedtke | 364/559 |
| 5,347,277 | 9/1994 | Nondahl et al. | 341/116 |
| 5,389,927 | 2/1995 | Turney et al. | 341/139 |
| 5,438,460 | 8/1995 | Coker et al. | 360/46 |

*Primary Examiner*—Marc S. Hoff
*Attorney, Agent, or Firm*—Fitzpatrick, Cella, Harper & Scinto

[57] ABSTRACT

A displacement amount detection apparatus detects the displacement amount of an object by utilizing two input signals which have a predetermined phase difference therebetween and are output in correspondence with a displacement of the object. The apparatus includes an amplifier which can arbitrarily set the amplification gains of the input signals, and a gain memorizer for dividing the two input signals obtained upon displacement of the object over a predetermined displacement range of the object into a plurality of displacement periods, and for memorizing the partial amplification gains of the amplifier in units of displacement periods on the basis of signals in the respective displacement periods. In addition, a controller selects the gains memorized in the gain memorizer and sets the selected gains in the amplifier when the amplifier amplifies the two input signals.

6 Claims, 3 Drawing Sheets

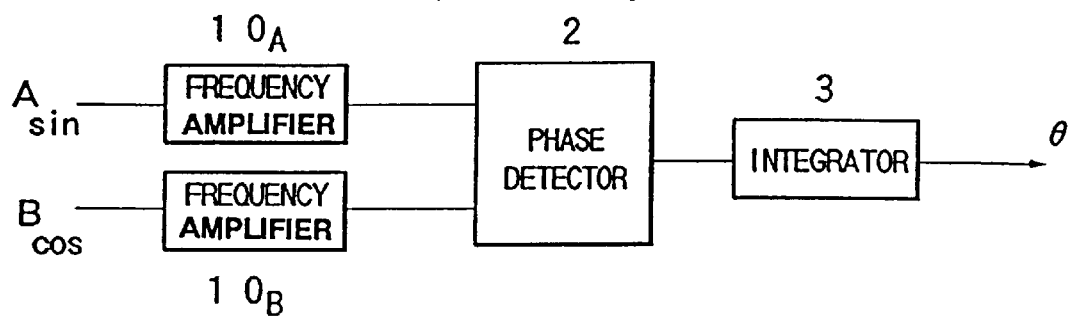
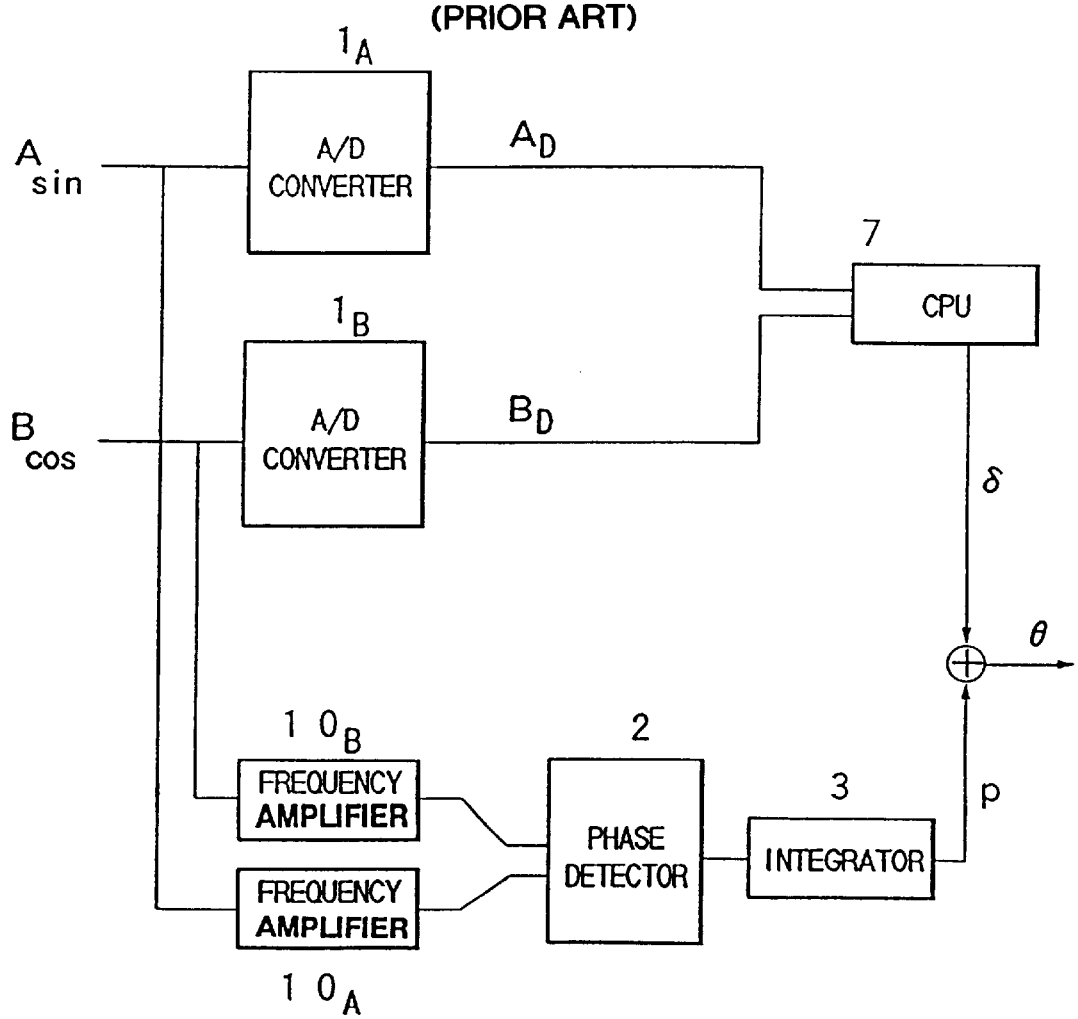

DISPLACEMENT AMOUNT DETECTION METHOD AND APPARATUS

BACKGROUND OF THE INVENTION

1. Field of the Invention

The present invention relates to a displacement amount detection method and apparatus, which can accurately detect the displacement amount such as a rotation amount, moving amount, or the like of an object as in a rotary encoder.

2. Related Background

In the industrial field, rotary encoders are popularly used in detection of the rotation information of rotary objects. The rotary encoders are roughly classified into incremental and absolute encoders. An incremental rotary encoder normally outputs two sine wave signals or rectangular wave signals as output signals, and processes these two signals to detect rotation information such as a rotation angle, rotation direction, and the like. With the advent of high-precision industrial machines such as robots in recent years, interpolation of the encoder output signals is normally performed to improve the detection precision of rotation information by the rotary encoder.

FIG. 1 is a block diagram showing the arrangement of a signal processing circuit used in a conventional rotary encoder (to be referred to as an "encoder" hereinafter). FIG. 1 is a block diagram of an interpolation circuit. Referring to FIG. 1, frequency amplifiers $10_A$ and $10_B$ respectively multiply the frequencies of input signals A and B by 2, and output the obtained signals. A phase detector 2 receives the two doubled sine wave signals A and B and detects a phase from the two signals. An integrator 3 integrates the phase signal from the phase detector 2 and outputs an accumulated angle θ.

In this signal processing circuit, two input signals A and B output from the encoder are sine wave signals having a 90° phase difference therebetween in correspondence with the rotation angle of the encoder. These input signals A and B output $p_o$ sine wave pulses per revolution of the rotation shaft of the encoder. The input signals A and B are converted into signals having doubled frequencies ($2p_o$ pulses per revolution of the rotation shaft) by the frequency amplifiers $10_A$ and $10_B$ and the converted signals are output to the phase detector 2. The phase detector 2 detects the phase of the two input signals with a predetermined precision, e.g., a precision of 1/40th of a period, and converts the phase signal into a digital signal. The detector 2 then outputs the digital signal to the integrator 3. The integrator 3 accumulates and counts the input digital signal as the number of pulses, and calculates/and outputs an accumulated rotation angle θ using a formula below on the basis of the accumulated count n:

$$\theta = 360° \cdot n/(2 \cdot 40 \cdot p_o)$$

In this case, finally, the amount of output pulses per revolution of the rotation shaft of the encoder becomes 80 times that of the signal output from the encoder, i.e., $80 \cdot p_o$.

However, this method suffers the problem of a large circuit scale, and another method has been proposed. FIG. 2 is a block diagram of a signal processing circuit adopting this method. Referring to FIG. 2, A/D converters $1_A$ and $1_B$ respectively convert analog signals A and B into digital signals $A_D$ and $B_D$. A calculation device (CPU) 7 comprises, e.g., a DSP, a microcomputer, or the like.

Referring to FIG. 2, two input signals A and B output from the encoder are converted into digital signals $A_D$ and $B_D$ by the A/D converters $1_A$ and $1_B$, and the digital signals are input to the CPU 7. The CPU 7 calculates a phase δ in one period of the input signals A and B using a formula below, and outputs the calculated phase:

$$\delta \tan^{-1} (A_D/B_D) \tag{1}$$

On the other hand, the input signals A and B are output to the frequency amplifiers $10_A$ and $10_B$ to be converted into signals with xm frequencies, and these signals are input to the phase detector 2. The phase detector 2 detects the phase of the input signals with a precision of $1/t^{th}$ of a period, and converts the phase signal into a digital signal. The phase detector 2 then outputs the digital phase signal to the integrator 3. The integrator 3 counts the input digital signals to obtain the accumulated count value n, and outputs the accumulated pulse count p of the input signals A and B using a formula below:

$$p = n/(m \cdot t) \text{ where } p \text{ is an integer}$$

The output p from the integrator 3 is added to the phase δ in one period, and the accumulated rotation angle θ is calculated and output using a formula below:

$$\theta = 360° \cdot \{p + (\delta/2\pi)\} p_o$$

With this method, the phase δ of the input signals can be detected with high precision by a relatively small-scale circuit arrangement. However, since the phase δ is calculated from the digital signals $A_D$ and $B_D$ obtained by A/D-converting the input signals from the encoder, the calculation precision is determined by the precision of the A/D converters $1_A$ and $1_B$. Therefore, it is desirable in terms of precision that the input signals A and B to the A/D converters have uniform peaks, and these peaks have maximum possible values in the range of the A/D converters.

However, since the amplitudes of the input signals A and B actually output from the encoder vary under the influence of, e.g., the rotation precision of a slit plate of the encoder, the levels of the input signals must be adjusted, so that the peak values of the input signals must fall within a predetermined range upon A/D conversion. For this reason, when the amplitudes of the input signals vary, the peak value input to the A/D converter becomes small in a certain portion of the input signals, resulting in low A/D conversion precision. As a result, the entire phase detection precision deteriorates.

SUMMARY OF THE INVENTION

It is an object of the present invention to provide a displacement amount detection apparatus, which detects the displacement amount of an object to be detected by A/D-converting two input sine wave signals into digital signals, and calculating the phase of the input signals on the basis of the inverse tangents of the digital signals, wherein the amplitude variations of the input sine wave signals are partially corrected, and the displacement amount can be detected with high precision.

In order to achieve the above object, according to one aspect of the present invention, there is provided a displacement amount detection apparatus which detects a displacement amount of an object by utilizing, as input signals, two sine wave signals which have a predetermined phase difference therebetween and are output in correspondence with a displacement of the object, comprising:

amplification means which can arbitrarily set amplification gains of the input signals;

gain memorizing means for dividing the two input signals obtained upon displacement of the object over a predetermined displacement range of the object into a plurality of displacement periods, and memorizing partial amplification gains of the amplification means in units of displacement periods on the basis of signals in the respective displacement periods; and control means for selecting the gains memorized in the gain memorizing means and setting the selected gains in the amplification means when the amplification means amplifies the two signals.

According to a preferred aspect, the displacement amount detection apparatus further comprises waveform memorizing means for memorizing the two input signals obtained upon displacement of the object over the predetermined displacement range of the object, and the gain memorizing means utilizes the two input signals memorized in the waveform memorizing means.

According to a preferred aspect, the displacement amount detection apparatus further comprises discriminating means for discriminating one of the divided displacement periods corresponding to a present position of the object upon detection of the displacement amount of the object, and the control means selects the gains of the gain memorizing means on the basis of a result of the discriminating means.

According to one aspect of the present invention, there is also provided a displacement amount detection method which amplifies, using amplification means, two sine wave signals which have a predetermined phase difference therebetween and are output in correspondence with a displacement of an object, and detects a displacement amount of the object by utilizing, as input signals, the two amplified signals, comprising the steps of:

dividing the two input signals obtained upon displacement of the object over a predetermined displacement range of the object into a plurality of displacement periods, and memorizing partial amplification gains of the amplification means in units of displacement periods on the basis of signals in the respective displacement periods; and selecting the gains memorized in the gain memorizing step and setting the selected gains in the amplification means when the amplification means amplifies the two input signals.

According to a preferred aspect, the displacement amount detection method further comprises the step of memorizing the two signals obtained upon displacement of the object over the predetermined displacement range of the object, and the gain memorizing step comprises the step of utilizing the two input signals memorized in the waveform memorizing step.

According a preferred aspect, the displacement amount detection method further comprises the step of discriminating one of the divided displacement periods corresponding to a present position of the object upon detection of the displacement amount of the object, and the setting step comprises the step of selecting the gains memorized in the gain memorizing step on the basis of a result in the discriminating step.

BRIEF DESCRIPTION OF THE DRAWINGS

FIG. 1 is a block diagram showing the first example of a conventional signal processing circuit;

FIG. 2 is a block diagram showing the second example of a conventional signal processing circuit;

DESCRIPTION OF THE PREFERRED EMBODIMENTS

Figure 3:
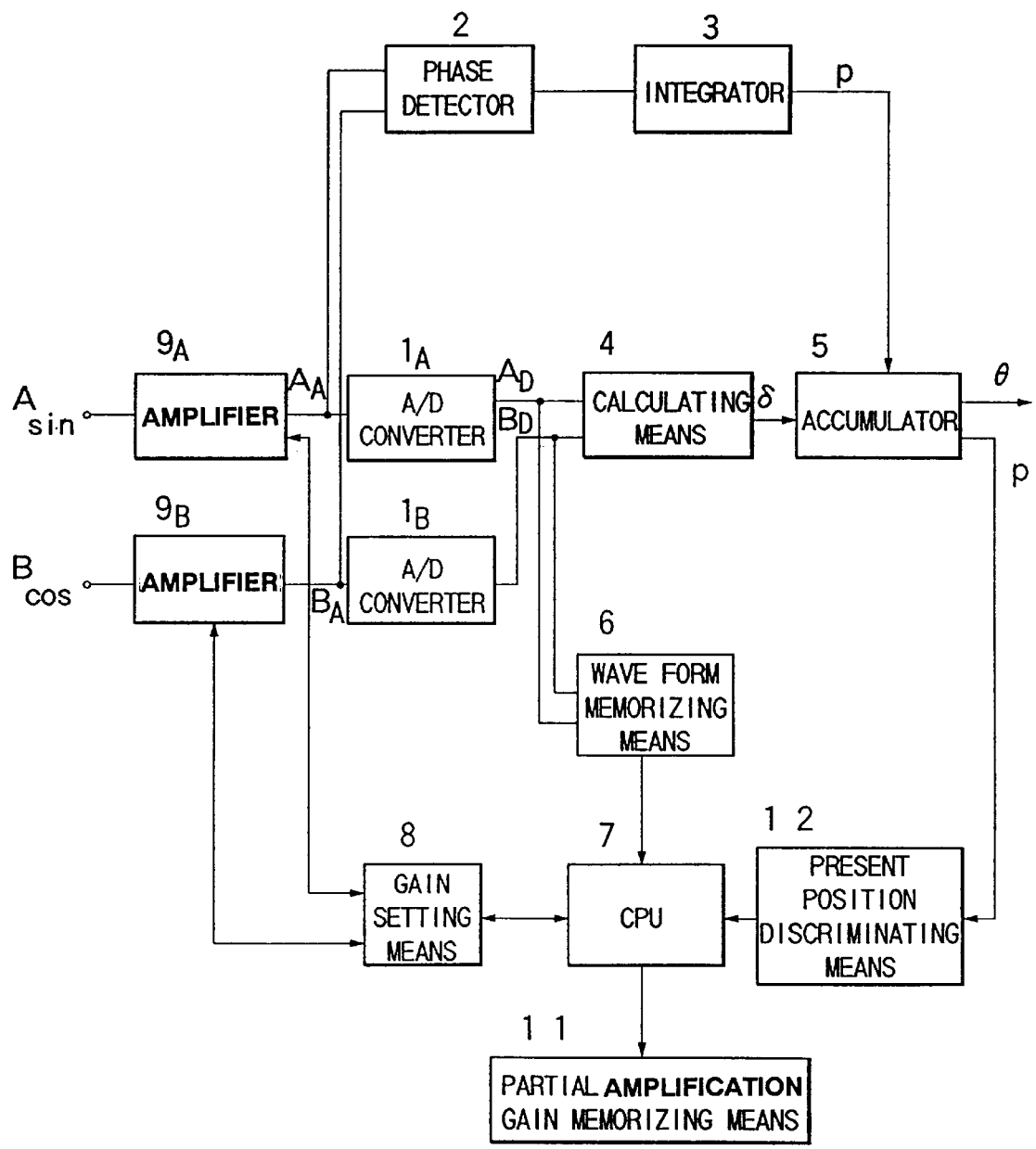
FIG. 3 is a block diagram showing a principal part of a signal processing circuit according to an embodiment of the present invention.

FIG. 3 is a block diagram showing a principal part of a signal processing circuit according to the first embodiment of the present invention.

Referring to FIG. 3, amplifiers (amplification means) $9_A$ and $9_B$ amplify the amplitudes of input signals A and B and output amplified signals. A/D converters $1_A$ and $1_B$ respectively convert analog signals $A_A$ and $B_A$ into digital signals $A_D$ and $B_D$. A calculating means 4 calculates a phase $\delta$ using formula (1) above from the two digital signals $A_D$ and $B_D$ having a 90° phase difference therebetween. A phase detector 2 receives two analog sine wave signals $A_A$ and $B_A$, detects the phase of the input signals with a precision of $1/t^{th}$ of a period, and converts the detected phase signal into a digital signal. The detector 2 outputs the digital signal to an integrator 3. The integrator 3 integrates digital signals from the phase detector 2, and obtains and outputs the accumulated pulse count p of the input signal on the basis of the accumulated value n of the digital signal using a formula below:

p=n/t where p is an integer

An accumulator 5 performs a calculation below using the accumulated pulse count p and the phase angle $\delta$ to obtain and output the accumulated rotation angle $\theta$:

$\theta=360°·\{p+(\delta/2)\}\pi)\}/p_o$ where $p_o$ is the number of sine wave pulses per revolution of the rotation shaft of an encoder.

A waveform memorizing means 6 memorizes an output signal for the displacement amount detection range or for one revolution of the rotation shaft of the encoder as a digital signal. A CPU (calculating means) 7 comprises, e.g., a DSP, a microcomputer, or the like. A gain setting means 8 sets the amplification factors (gains) of the amplifiers $9_A$ and $9_B$ in correspondence with a command from the CPU 7. A partial amplification gain memorizing means 11 memorizes optimal partial amplification gain values $g_i$ to be applied to m divided portions obtained by dividing a predetermined detection range into a plurality of (m) portions. A present position discriminating means 12 discriminates one of the m divided portions corresponding to the present position of an object on the basis of the total rotation angle $\theta$ of the object, and outputs a signal to the CPU 7.

The operation of this embodiment will be described below. In the displacement amount detection apparatus of the present invention, prior to actual displacement amount detection, partial amplification gain values $g_i$ of input signals A and B are set and memorized by the method to be described below. The CPU 7 controls the gain setting means 8 to set the gains of the amplifiers $9_A$ and $9_B$ to be 1. The rotation shaft of the encoder is rotated for the displacement amount detection range when the displacement amount detection range is within one revolution of the rotation shaft of the encoder, or for a one-revolution range of the rotation shaft of the encoder when the displacement amount detection range exceeds one revolution of the rotation shaft of the encoder. Output signals A and B from the encoder are input to the amplifiers $9_A$ and $9_B$, and signals $A_A$ and $B_A$ having the same levels as the input signals are output to the A/D converters $1_A$ and $1_B$. The A/D converters $1_A$ and $1_B$ convert the input signals $A_A$ and $B_A$ into digital signals $A_D$ and $B_D$, and outputs the digital signals. The waveform memorizing means 6 receives these digital signals.

Figure 4:
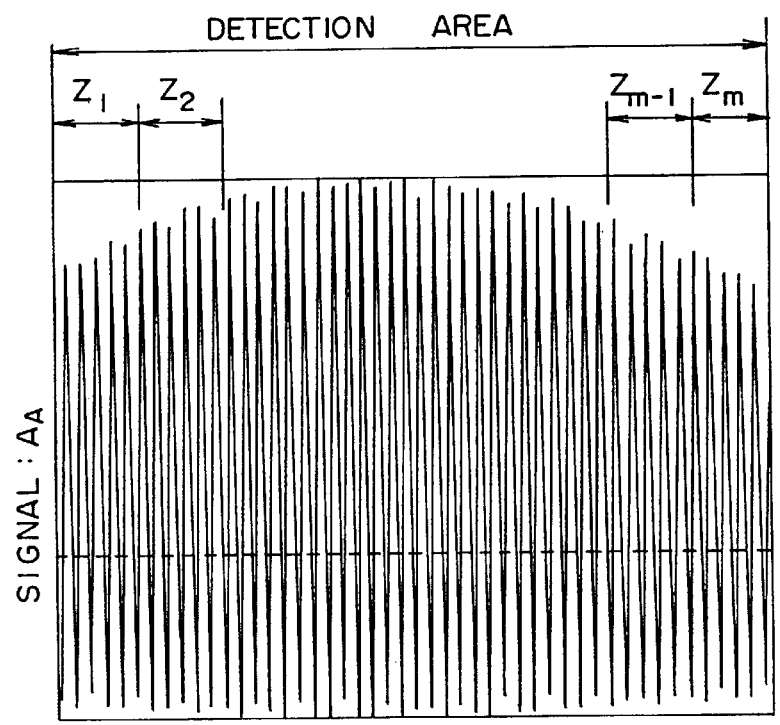
FIG. 4 is a waveform chart showing the waveform of an input signal.

FIG. 4 shows the waveform of the signal $A_D$ received by the waveform memorizing means (although the signal $A_D$ has a digital value in practice, the signal is expressed in the form of the analog signal $A_A$ for the purpose of easy understanding). The CPU 7 divides the one-revolution detection range of the rotation shaft into m displacement periods $z_1, z_2, \ldots, z_m$, and determines partial amplification gains $g_1, g_2, \ldots, g_m$, which can maximize the levels of the digital signals obtained by A/D-converting the input signals A and B within the ranges of the A/D converters $1_A$ and $1_B$, in correspondence with the divided periods.

The method is as follows. That is, the CPU 7 obtains peak points, in the corresponding displacement periods, of the signals $A_D$ and $B_D$, and determines a gain which can maximize a larger one of maximum values $v_{Amax}$ and $V_{Bmax}$ at the peak points within the ranges of the A/D converters $1_A$ and $1_B$.

Figure 5:
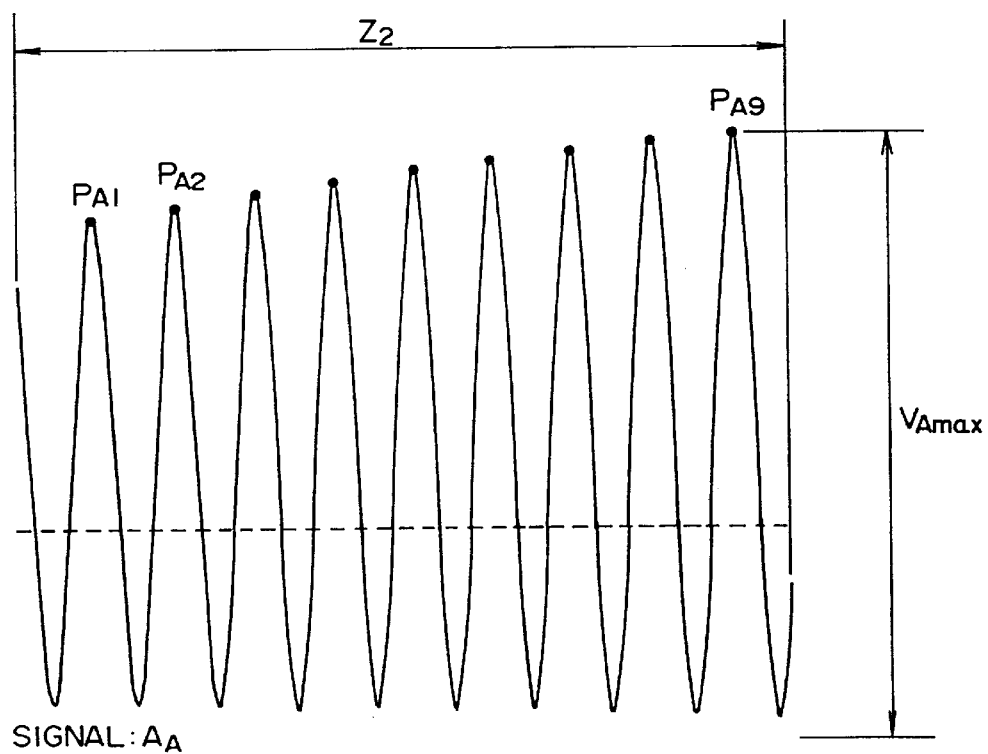
FIG. 5 is a partial enlarged view of FIG. 4.

For example, FIG. 5 is a detailed view of the digital signal $A_D$ in the displacement period $z_2$ in FIG. 4 (although the signal $A_D$ has a digital value in practice, the signal is expressed in the form of the analog signal $A_A$ for the purpose of easy understanding). The CPU 7 detects peak points $P_{A1}$, $P_{A2}, \ldots, P_{A9}$ from the displacement period $z_2$, and also detects the maximum value $V_{Amax}$ (in this case, $p_{A9}$) from these peak points. Similarly, the CPU 7 detects the maximum value $V_{Bmax}$ from the signal B. Using larger one (assumed to be $V_{Amax}$, corresponding to a maximum input peak signal) of $V_{Amax}$ and $V_{Bmax}$, the CPU 7 calculates a partial amplification gain $g_2$ ($=v_o/V_{Amax}$) in the period $z_2$ so that the conversion result of the A/D converters $1_A$ and $1_B$ has a predetermined maximum value $v_o$ in the range of the A/D converter, and stores the calculated gain in the partial amplification gain memorizing means 11. The determined partial amplification gains $g_1, g_2, \ldots, g_m$ are stored in the partial amplification gain memorizing means 11.

In this manner, the partial amplification gains $g_1$ are determined and memorized.

Then, the displacement amount is detected. Two input signals (analog signals) A and B output from an encoder (not shown) are sine wave signals having a 90° phase difference therebetween in correspondence with the rotation angle, θ, of the rotation shaft to which the encoder is attached, and $p_o$ signals are output per revolution of the rotation shaft of the encoder. The input signals A and B are amplified to signals $A_A$ and $B_A$ via the amplifiers $9_A$ and $9_B$, and the signals $A_A$ and $B_A$ are respectively input to the A/D converters $1_A$ and $1_B$. The signals $A_A$ and $B_A$ are converted into digital signals $A_D$ and $B_D$ by the A/D converters $1_A$ and $1_B$, and the digital signals are input to the calculating means 4. The calculating means 4 calculates the phase δ in one period on the basis of the digital signals $A_D$ and $B_D$ using a formula below:

$$\delta \tan^{-1}(A_D/B_D) \quad (2)$$

On the other hand, the amplified input signals $A_A$ and $B_A$ output from the amplifiers $9_A$ and $9_B$ are input to the phase detector 2. The phase detector 2 detects the phase at a 1/t period, and the integrator 3 counts the input digital signal. The integrator 3 makes a calculation below using the accumulated value n of the digital signal, thus outputting the accumulated pulse count p from the encoder:

p=n/t where p is an integer

The accumulator 5 calculates the total rotation angle θ of the rotation shaft of the encoder using the phase δ in one period calculated by the calculating means 4 and the accumulated pulse count p output from the integrator 3 by a formula below:

$$\theta = 360° \cdot \{p+(\delta/2\pi)\}/p_o$$

where $p_o$ is the number of sine wave pulses per revolution of the rotation shaft of an encoder.

In the above-mentioned signal processing, the present position discriminating means 12 discriminates one of the periods $z_1, z_2, \ldots, z_m$ corresponding to the present displacement position on the basis of the accumulated pulse count p output from the accumulator 5 (assume that the present position corresponds to the period $z_i$), and outputs the information to the CPU 7. The CPU 7 reads out the partial amplification gain $g_i$ of the discriminated period from the partial amplification gain memorizing means 11 on the basis of the input information, and supplies a command to the gain setting means 8, thus setting the gain of the amplifiers $9_A$ and $9_B$ to be $g_i$. In this manner, the gains of the amplifiers $9_A$ and $9_B$ are selected to maximize the signal level in each period in correspondence with the displacement pulse count p, thereby realizing signal processing free from deterioration of precision upon detection of the phase δ.

In this embodiment, the peak values of the signal in each period are used for determining the partial amplification gain $g_i$. In place of the peak values, a histogram may be formed for each period of the input signal, and the gain may be determined based on the histogram distribution using a technique such as a p tile method.

The invention may be embodied in other specific forms without departing from the spirit or essential characteristics thereof. The present invention is therefore to be considered in all respects as illustrative and not restrictive, the scope of the invention being indicated by the appended claims rather than by the foregoing description and all changes which come within the meaning and range of equivalency of the claims are therefore intended to be embraced therein.

What is claimed is:

1. A displacement amount detecting apparatus for detecting an amount of displacement of an object by use of two input signals having a predetermined phase difference therebetween which are outputted in conformity with the displacement of the object, comprising:

amplification means which can arbitrarily set amplification gains of the input signals;

gain memorizing means for dividing the two input signals obtained upon displacement of the object over a predetermined displacement range of the object into a plurality of displacement periods, and memorizing partial amplification gains of said amplification means in units of displacement periods on the basis of signals in the respective displacement periods; and control means for selecting the gains memorized in said gain memorizing means and setting the selected gains in said amplification means when said amplification means amplifies the two input signals.

2. An apparatus according to claim 1, further comprising waveform memorizing means for memorizing the two input signals obtained upon displacement of the object over the predetermined displacement range of the object, and wherein said gain memorizing means utilities the two input signals memorized in said waveform memorizing means.

3. An apparatus according to claim 1, further comprising discriminating means for discriminating one of the divided displacement periods corresponding to a present position of the object upon detection of the displacement amount of the object, and wherein said control means selects the gains of said gain memorizing means on the basis of a result of said discriminating means.

4. A displacement amount detecting method for detecting an amount of displacement of an object by use of two input signals having a predetermined phase difference therebetween which are outputted in conformity with the displacement of the object, comprising the steps of:

amplifying the two input signals by amplification means;

dividing the two input signals obtained upon displacement of the object over a predetermined displacement range of the object into a plurality of displacement periods, and memorizing partial amplification gains of the amplification means in units of displacement periods on the basis of signals in the respective displacement periods; and selecting the gains memorized in the gain memorizing step and setting the selected gains in the amplification means when the amplification means amplifies the two input signals.

5. A method according to claim 4, further comprising the step of memorizing the two signals obtained upon displacement of the object over the predetermined displacement range of the object, and wherein the gain memorizing step comprises the step of utilizing the two input signals memorized in the waveform memorizing step.

6. A method according to claim 4, further comprising the step of discriminating one of the divided displacement periods corresponding to a present position of the object upon detection of the displacement amount of the object, and wherein the setting step comprises the step of selecting the gains memorized in the gain memorizing step on the basis of a result in the discriminating step.

* * * * *

UNITED STATES PATENT AND TRADEMARK OFFICE
CERTIFICATE OF CORRECTION

PATENT NO. : 5,805,090
DATED : September 8, 1998
INVENTOR(S) : Sato

It is certified that error appears in the above-identified patent and that said Letters Patent is hereby corrected as shown below:

COLUMN 6:

Line 66, "utilities" should read --utilizes--.

Signed and Sealed this

Sixth Day of July, 1999

Attest:

Q. TODD DICKINSON

*Attesting Officer*   Acting Commissioner of Patents and Trademarks